United States Patent
Cooper et al.

(10) Patent No.: US 6,772,388 B2
(45) Date of Patent: Aug. 3, 2004

(54) APPARATUS AND METHOD FOR PROVIDING OPTIMAL ADAPTIVE FORWARD ERROR CORRECTION IN DATA COMMUNICATIONS

(75) Inventors: Michael J. Cooper, Marietta, GA (US); Stephen Schroeder, Stoughton, MA (US)

(73) Assignee: Motorola, Inc, Schaumburg, IL (US)

(*) Notice: Subject to any disclaimer, the term of this patent is extended or adjusted under 35 U.S.C. 154(b) by 519 days.

(21) Appl. No.: 09/731,095

(22) Filed: Dec. 6, 2000

(65) Prior Publication Data

US 2004/0015765 A1 Jan. 22, 2004

(51) Int. Cl.[7] .............................................. H03M 13/35
(52) U.S. Cl. ...................................................... 714/774
(58) Field of Search ................................ 714/774, 708

(56) References Cited

U.S. PATENT DOCUMENTS

| | | | | |
|---|---|---|---|---|
| 5,600,663 A | * | 2/1997 | Ayanoglu et al. | ........... 714/744 |
| 5,699,365 A | | 12/1997 | Klayman et al. | |
| 5,699,369 A | | 12/1997 | Guha | |
| 5,719,883 A | * | 2/1998 | Ayanoglu | .................... 714/751 |
| 5,870,412 A | | 2/1999 | Schuster et al. | |

* cited by examiner

Primary Examiner—Stephen M. Baker
(74) Attorney, Agent, or Firm—Esteban A. Rockett; John V. Silverio; Caroline Coker

(57) ABSTRACT

An adaptive and dynamic forward error correction scheme for a communication channel is disclosed. The method and apparatus calculates the actual bit error rate for comparison with a target bit error rate. When a channel is performing better than required by the performance specifications, the forward error correction power can be reduced to provide greater throughput. If the calculated actual bit error rate is greater than the target bit error rate, then the forward error correction power is increased in an attempt to lower the calculated bit error rate. A feedback loop is employed to continually calculate revised bit error rates as the forward error correction power is increased or decreased.

18 Claims, 2 Drawing Sheets

APPARATUS AND METHOD FOR PROVIDING OPTIMAL ADAPTIVE FORWARD ERROR CORRECTION IN DATA COMMUNICATIONS

FIELD OF THE INVENTION

The invention relates, in general, to data communications and data communications systems and devices and, more specifically, to an apparatus and method for adaptively providing a degree of forward error correction that is optimized to achieve desired performance metrics in a data communications system.

BACKGROUND OF THE INVENTION

The transmission of information in digital form continues to grow at an exponential rate. Analog information including text, video, audio, and multimedia is digitized for transmission over a wireless or wire-based communications network. Generally, with the exception of baseband communications schemes, the digital information is modulated over a radio frequency carrier for efficient transmission over the communications medium. The information can be carried over the communications link continuously or in packets, and further can be time or frequency multiplexed to provide more efficient use of the channel for multi-user access.

One such specific communications system employing digitally encoded video, voice and other forms of data, is the CableComm™ System currently deployed by Motorola, Inc. of Schaumburg, Ill. In the CableComm™ System, a hybrid optical fiber and coaxial cable is utilized to provide substantial bandwidth over existing cable television lines to receiving stations, such as individual subscriber access units located at, for example, households having cable television capability. The coaxial cables are further connected to fiber optical cables terminating at a central location (referred to as the "head end") where controlling, receiving and transmitting equipment resides. The head end equipment may be connected to any variety of network or other information sources, such as the Internet, online services, telephone networks, video/movie subscriber services, and over-the-air program signals. With the CableComm™ System, digital data can be transmitted both in the downstream direction, from the head end to an individual or multiple users, or in the upstream direction, from the user to the head end.

In one embodiment of the CableComm™ System, downstream data is transmitted using 64 quadrature amplitude modulation ("QAM") at a rate of 30 Mbps (megabits per second), over channels having 6 MHz bandwidth in the frequency spectrum of 88–860 MHz. Anticipating asymmetrical requirements with a significantly greater quantity of data tending to be transmitted in the downstream direction than the upstream direction, less capacity is provided for upstream data transmission. The upstream channel utilizes π/4 differential quadrature phase shift keying (π/4-DQPSK) modulation in the frequency band from 5–42 MHz with a symbol rate of 384 k symbols/sec with 2 bits/symbol. The communications system is designed to have a multipoint configuration, i.e., many end users transmitting upstream to the head end, with one or more head end stations transmitting downstream to the end users.

The communications system is designed for asynchronous transmission, with users independently transmitting and receiving packets of encoded data, such as video or text files. Transmission in this application is generally bursty, with users receiving or transmitting data at indeterminate intervals over selected channels in response to polling, contention, or other protocols established at the head end, rather than transmitting more or less continuously with synchronous streams of information over a dedicated or circuit switched connection.

For asynchronous data transmission, it is desirable to organize the data into recognizable frames or packets for reliable detection by the receiver. In the CableComm™ System, the data packet preamble contains timing and synchronization information to ensure accurate data reception and decoding. The timing information is followed by the source or application information, which may be encoded for both security (encryption) and for error detection and correction. Following the information or application data is the error correction checksum information (appearing as encoded bits) which allows both error detection and error correction at the receiving terminal.

Impairments in the transmission channel and failures within the communication devices inevitably produce noise conditions errors in one or more bits, (which are especially troublesome when they occur in the information portion of the transmitted word) leading to decoding errors. It is therefore desirable to detect and if possible correct such errors during the decoding process at the receiving end. The basic premise of error detection and correction (referred to as forward error correction or FEC) is to transmit additional bits, referred to as check bits (or check bytes, check sum bits or forward error correcting bits), in addition to the information. Forward error correction requires that more bits than are necessary to simply transmit the information be appended to the transmitted word so that the error detection and correction processes can be carried out at the receiving end.

One difficulty arising from the inclusion of error correction information is the attendant increase in overall word or packet size, adding overhead for data transmission and correspondingly decreasing data throughput. Also, the inclusion of error correction information typically increases the system response time or latency, due to the extra time consumed by the error detecting and correcting process when decoding the check sum word. To constrain the extra overhead, at least to a degree, the number of data errors that can be corrected, referred to as the forward error correcting power, is selected to meet the required performance demands of the communications system. However, the amount of overhead incurred by the system is directly proportional to the selected forward error correcting power. There may be some situations, such as low noise conditions, in which the forward error correcting power is "excessive", and therefore a higher data throughput can be achieved by reducing the forward error correction power. But, when insufficient correcting power is applied, the overall throughput performance of the system will suffer due to errors in the transmitted data that the correction scheme cannot correct, necessitating the retransmission of the uncorrectable words. Ideally, the correcting power applied should be matched to the impairment level of the communications channel, as the channel conditions change with time.

Various prior art methods are known for providing error correction capability. However, typically these methods utilize only a fixed error correction capability, without regard to the specific noise conditions of the channel and the possible opportunities to increase data throughput and decrease response latency when lower noise conditions are present.

Since the impairment or noise levels on a channel may vary with time, an adaptable and flexible error correction capability is required for providing sufficient error correction for accurate data reception while simultaneously minimizing overhead for increased data throughput. U.S. Pat. No. 5,699,365, assigned to the assignee of the present invention, provides a limited degree of adaptable and flexible error correction capability. The apparatus and method disclosed in the patent monitors a parameter of the communications channel and then compares the actual parametric value with a threshold level. If the monitored parameter is not within a threshold value, an additional degree of forward error correction is added to the transmitted bit stream. Disadvantageously, this prior art mechanism lacks the ability to quantitatively determine the optimal forward error correction power to be applied at a given time over a given communications channel and therefore the amount of error correction power to be added. Further, it does not specify an algorithm using statistical metrics provided by common forward error correcting (FEC) commercial off-the-shelf integrated circuits, and how the metrics should be manipulated to adaptively revise FEC process parameters. The present invention provides a mechanism for calculating such a metric based upon commonly available FEC chips and specifies an algorithm for updating such forward error correction parameters as a result of this calculation.

BRIEF DESCRIPTION OF THE DRAWINGS

The present invention can be more easily understood and the further advantages and uses thereof more readily apparent, when considered in view of the description of the preferred embodiments and the following figures in which.

DETAILED DESCRIPTION OF THE PREFERRED EMBODIMENTS

Figure 1:
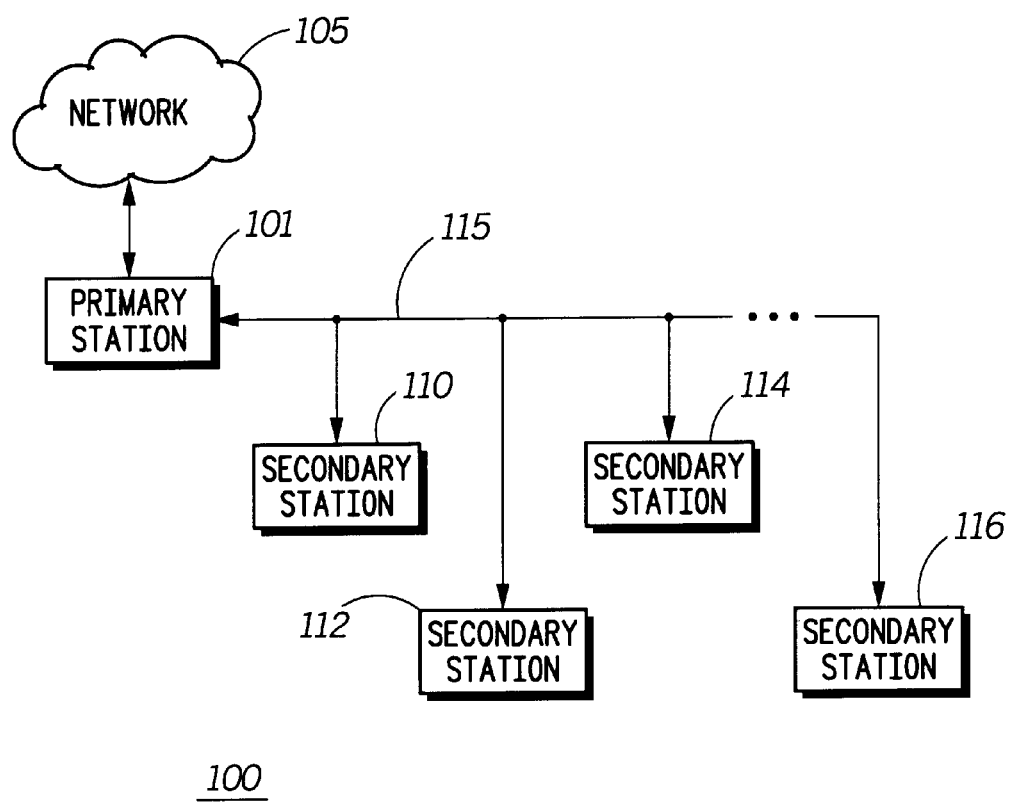
FIG. 1 is a block diagram illustrating a communications system in accordance with the present invention.

Before describing in detail the particular forward error correction method and apparatus in accordance with the present invention, it should be observed that the present invention resides primarily in a combination of steps and apparatus related to forward error correction. Accordingly, the hardware components and method steps have been represented by conventional elements in the drawings, showing only those specific details that are pertinent to the present invention so as not to obscure the disclosure with element details that will be readily apparent to those skilled in the art having the benefit of the description herein.

As discussed above, there remains a need for a method and apparatus to provide adaptive and quantitative forward error correction in a communications system. The apparatus and method in accordance with the present invention provides a dynamic and quantitative technique for determining the optimal forward error correction required by the communications link, based on one or more link performance parameters. As a result, according to the teachings of the present invention, there is provided an algorithm for an improved forward error correction parameter optimization technique, which minimizes overhead and satisfies system latency requirements, thereby providing increased data throughput. Advantageously, the apparatus and method of the present invention can adaptively respond to changing noise-related conditions in the communications channel by adapting the forward error correcting power due to those changing conditions. All of this is achievable using commonly available integrated circuits that implement the forward error correction decoding process.

FIG. 1 is a block diagram illustrating a communications system 100 in accordance with the teachings of the present invention. The communications system 100 includes a primary station 101, in one embodiment a primary transceiver, coupled to a plurality of secondary stations 110, 112, 114, and 116, in one embodiment operating as transceivers, via a communications medium 115. In the preferred embodiment, the communication medium 115 is hybrid optical fiber and coaxial cable. As is well-known to those skilled in the art, in other embodiments, the communications medium may be coaxial cable, fiber optic cable, twisted pair copper wires, etc., and may also include the air, atmosphere or space for wireless and satellite-based communications. The primary station 101 is also coupled to a network 105, which may include networks such as the Internet, online services, telephone and cable television networks, digital packet-based networks, and other communications networks. In other embodiments, the secondary stations 110, 112, 114, and 116 can be connected to more than one primary station, and further can be connected to each primary station by a plurality of communications media, such as those mentioned above. Also, the network 105 is not a required element of the invention, as the inventive concepts can be employed over the communications medium 115.

In the preferred embodiment, the communication medium 115 has or supports a plurality of communications channels. For ease in reference, the communications channels over which the primary station 101 transmits information signals or other data to a secondary station, such as the secondary station 114, are referred to as downstream channels. Similarly, the communications channels over which the secondary station 114 transmits information signals or other data to the primary station 101 are referred to as upstream communications channels. As is known to those skilled in the art, the upstream and downstream channels may be the same physical channel (through the use of time division or frequency division or code division multiplexing, for instance) or may be separate physical channels. These various channels may also be logically divided in other ways, in addition to the upstream and downstream directions. As mentioned above, in the preferred embodiment of the CableComm™ System, the communications medium is hybrid fiber coaxial cable, with downstream channels in the frequency spectrum of 88–860 MHz, and upstream channels in the frequency spectrum of 5–42 MHz.

Dependent upon the specific application of the present invention, the primary station 101 can be a simple transmitter for point-to-point or point-to-multipoint communications with one or more of the secondary stations 110, 112, 114, and 116. In another embodiment, the primary station 101 can be a bi-directional transceiver for point-to-point and point-to-multipoint communications with the secondary stations 110, 112, 114, and 116. In the embodiment where the primary station 101 is an element of the CableComm™ System, the primary station 101 includes a plurality of processors, memory units, receivers and transmitters for bidrectionally communicating with each of the secondary stations 110, 112, 114, and 116 to provide differentiated signals in both the upstream and downstream directions. The plurality of processors provide functions related to upstream and downstream data protocols, such as sending polling messages or acknowledgment messages. Essentially, the processors control the various functions associated with the primary station 101. Each of the receivers may include a serial communications processor, a digital signal processor, a ZIF SYN integrated circuit available from Motorola of Schamburg, Ill. and a Reed-Solomon decoder for decoding forward error detection and correction bytes. In the preferred embodiment, also depending upon the functions implemented, each of the transmitters may include a serial communications processor, a digital signal processor, a ZIF SYN integrated circuit and a Reed-Solomon encoder for modulation and for coding for forward error correction and cyclic redundancy checks. As a consequence, as used herein, the primary station 101 may perform all the functions of data and other signal reception and transmission, regardless of the specific hardware implementation and additional features that may or may not be implemented. Finally, the primary station includes a network interface device (which is well-known in the art) for interfacing with the network 105 in those embodiments where the network 105 is present. Commonly-assigned U.S. Pat. No. 5,699,365 (as discussed above) can be consulted for additional details of the primary station 101 as used in a CableComm™ System application.

Likewise, each secondary station 110, 112, 114 and 116 includes a processor and memory unit for receiving and sending bi-directional communications via the communication media 115. Each secondary station can further be connected to data terminal equipment for processing digital data received by the secondary station. In one embodiment, the components of the secondary stations 110, 112, 114, and 116 perform such functions as QAM demodulation and forward error correction decoding (for downstream signals), QPSK modulation and forward error correction encoding (for upstream transmission), and transmit level and frequency adjustment. In the preferred embodiment, the processor for controlling each of the secondary stations 110, 112, 114, and 116 is a Motorola M68302 processor (also known as an integrated multiprotocol processor), including associated memory. The processor is coupled to an Ethernet port or a data interface for connection to a computer, work station, or other data terminal equipment. The processor is also coupled to a channel interface unit for communications over the communications medium 115. The channel interface unit, depending upon the functions implemented, can include a serial communications integrated circuit, a ZIF SYN Integrated Circuit, a Broadcom BCM 3100 QAMLink Integrated Circuit (available from Broadcom, Inc. of Irvine, Calif.) a Motorola TxMod integrated circuit, and LSI Logic L64711 and L64714 (available from LSI Logic Corporation of Milpitas, Calif.) integrated circuits for performing the aforementioned functions. Commonly assigned U.S. Pat. No. 5,699,365 (as discussed above) can be consulted for additional details of the secondary stations 110, 112, 114, and 116 as used in the CableComm™ System application.

As discussed above, the upstream channels of the communications medium in the preferred CableComm™ System, are in the frequency range between 5 and 42 MHz and may be susceptible to interference from multiple noise sources. Similarly, wireless communications systems are susceptible to noise sources that disrupt the channel on a random and unpredictable basis. Forward error correction is preferably employed in a communications channel, for instance on the upstream channel with respect to the preferred embodiment, to compensate for data transmission errors caused by noise or other distortions. Forward error correction comprises an error correcting code that is appended to the information or application bits to allow a receiver to detect and correct certain types and sizes of errors that may have occurred during the transmission of the data. The transmitting unit, such as a secondary station 112, derives the error correcting code from the information or application bits and appends the error correcting code to the information or application bits for transmission. The receiving unit, such as the primary station 101 uses the error correcting code to detect received errors in the information or application bits data and to correct as many detected errors as permitted by the number of error correcting bits (or bytes). As a consequence, the receiving unit must know, prior to the receipt of the data, the type of error correcting code employed at the transmitter so that proper decoding and error correction can be accomplished at the receiver. This exchange of forward error correction information may be accomplished by prior arrangement, during a parameter exchange message sequence that occurs at fixed periodic intervals or at sporadic intervals that coincide with changes in the quality of the communications link, as taught and claimed in commonly owned U.S. Pat. No. 5,699,365.

The preferred embodiment of the present invention applies to a Reed-Solomon error correcting code for forward error correction which is typically used on the upstream channel of the communications system 100. The Reed-Solomon error correcting code is a block error correcting code where the error correcting bits are computed over a fixed-size block of data. A Reed-Solomon code is typically specified by a parameter pair (n, k), where "n" is the code word size and "k" is the block size (i.e., the number of information bytes). An n-byte codeword therefore consists of k information bytes plus (n–k) error correcting code bytes. The maximum number of symbol errors (where a symbol is typically one 8-bit byte), t, that can be corrected by a Reed-Solomon code is t=(n–k)/2. One commonly used Reed-Solomon code is a (128, 122) code, where the code word size is 128 bytes with each code word comprising 122 information bytes and 6 error correcting code bytes. A decoder operating on this data can therefore correct up to three distinct byte errors in the 128 byte code word. (By distinct, it is meant that the three byte-errors do not have to be within consecutive bytes.) As would be obvious to those skilled in the art, other error correcting codes may be used in conjunction with the teachings of the present invention.

In a typical prior art forward error correction implementation, the forward error correction parameters are set to a predetermined and fixed value to compensate for a particular level of expected noise on the communications channel. If the noise level increases above the expected level, the forward error correction scheme will be unable to correct all of the transmission errors. The corrupted data must therefore be retransmitted or, in a worst case situation, the communications channel may no longer be usable. The data throughput is significantly decreased due to the retransmission time, or in the worst case eliminated. Similarly, if the noise level decreases below the expected level, the realized data throughput will be less than the maximum throughput supported by the channel due to the transmission of an excessive number of corrections bytes, which are not necessary.

Establishing the forward error correction parameters requires balancing the amount of overhead added by the error correcting code (because the error correcting codes utilizes bandwidth that could have been used for information and therefore decreases information throughput) and the amount of error correction needed due to channel conditions (which may serve to increase data throughput through avoidance of retransmission). In the optimum situation, to maximize throughput of information over a given communications channel, the error correcting code would utilize precisely enough error correction to compensate for the existing noise level, no more or no less. More error correcting capability lowers throughput due to the excessive overhead of transmitting error correcting codes which are not needed. Insufficient forward error correcting power lowers the throughput due to the overhead created by the retransmission of information received in error. However, the level of noise on a communications channel varies over time, therefore rendering the selection of a fixed set of forward error correction parameters less than optimal at any given time.

Further, it is important to minimize the throughput delay or latency introduced by the communications equipment, e.g., the receiver of a communications system. Throughput delay in a polled protocol, for example, may be defined as the time between the sending of a polling message prior to forward error correction encoding and the receipt of a response to the polling message following forward error correction decoding. The forward error correcting codes typically introduce additional throughput delay at the communications equipment due to the processing and computational time requirements for error correction encoding and decoding. The delay introduced by the Reed-Solomon encoding/decoding process is proportional to the code word size and the number of error correcting bytes. Further when utilizing block FEC codes, the entire code block must be received before the decoding can be completed, thus eliminating the possibility of processing the first bits of the transmission prior to receiving the final bits.

As discussed in greater detail below, the algorithm of the present invention provides a technique for changing the forward error correction parameters in a communications channel between two or more data communications stations based on predetermined channel performance metrics including bit error rate, FEC corrected code words, FEC uncorrectable code words, latency, and percent utilization of the communications channel. As a result, the preferred embodiment of the present invention provides an algorithm and method, which can be implemented with readily available commercial FEC integrated circuits, to optimize data throughput for varying noise levels (and the attendant error rates), while also not exceeding a required maximum throughput delay or latency for the communications channel.

The teachings of the present invention disclose an algorithm wherein the forward error correction configuration parameters employed on a communications channel are dynamically changed in response to the real-time or near real-time noise characteristics encountered on the channel. In particular, the forward error configuration parameters include both the number of check bytes and the code word length, which is defined as the number of bytes in the information portion of the code word plus the number of bytes in the error correcting portion of the code word (i.e., the checksum or check byte length). As will be discussed further hereinbelow, according to the present invention, the receiver executes a process for determining if and when the code word length or the check byte length can be dynamically adjusted, while still satisfying the system performance objectives. Once the receiver has determined that a change in either of these parameters can be made, this information must be communicated to the transmitter so that both units are operating with the same forward error correction parameters.

Those skilled in the art associated with the present invention realize that if the communications channel conditions were known a priori and these conditions did not change during the communications interval, then the forward error correction parameters could simply be set to achieve the desired performance characteristics, including achieving a target error rate, (e.g., a bit error rate, packet error rate, burst error rate, block error rate, or frame error rate) optimizing the overhead required to send error correcting codes and limiting the system latency. For example, under operating conditions in which few errors will be allowed, the target error rate will be comparatively low. Under circumstances in which latency is a more significant system requirement and more errors allowed, the target error rate may be comparatively higher.

When the calculated or measured error parameter is less than the threshold level (minus any allowable variance), this indicates that the channel conditions are of a comparatively higher quality (relatively lower noise conditions). Fewer errors are occurring and these errors are capable of being corrected by the forward error correcting code. Under these conditions, the forward error correcting code parameter can be revised to lower the degree of forward error correction capability (i.e., capable of correcting fewer errors) to reduce the margin between the measured error level and the threshold level. By lowering the forward error correction power, the overhead and latency associated with the forward error correction scheme will also be reduced. Conversely, if the channel error parameter is greater than the target threshold level (plus any allowable variance) thus indicating that the channel has a comparatively low or poor quality and the noise is causing more errors than are desired and than are capable of being corrected by the error correcting code, then a revised forward error correcting parameter is employed to provide a higher degree of forward error correction power, i.e., capable of correcting more errors. This higher degree of forward error correction will increase the latency and forward error correction overhead, but will also decrease the overhead resulting from the retransmission of an entire data packet due to the inability to correct errors therein.

Most of the commercially available integrated circuits that are used to provide forward error correction through the use of well-known algorithms (such as Reed-Solomon) provide certain forward error correction statistics, such as the number of uncorrectable block errors received, number of received blocks which were corrected, and the total number of FEC blocks received one such commonly available chip is produced by LSI Logic Corporation of Milpitas, Calif. and referred to as part no. L64714. The statistical information available from this chip is used advantageously in conjunction with the present invention to determine whether the forward error correction parameters should be changed, while still maintaining the desired communications channel performance-related parameters, and whether that change involves an increase or decrease in the specified parameters.

Bit streams to which forward error correction is applied are generally divided into a plurality of frames, with each frame referred to as a code word. Each code word is further divided into two portions, the information or application data to be transmitted over the channel (and corrected in the event errors arise), and the error correcting portion that allows a receiving station to detect and correct errors in the information bits. The correcting power of any forward error correction scheme can be increased by increasing the number of error correcting bytes, decreasing the amount of information data contained in a code word (i.e., the number of information bytes in the code word), or performing both of these operations. Decreasing the code word length while maintaining the same number of error correcting bytes has the effect of increasing the error correcting power because there are fewer information bytes relative to the number of correcting bytes. Conversely, the correcting power of any forward error correction scheme can be decreased by decreasing the number of error correcting bytes, increasing the amount of information data contained in a code word, or performing both of these operations. In an ideal communications channel with no errors in the transmitted data packets, increasing the forward error correcting power decreases the effective channel data throughput as a result of the increased number of forward error correcting bytes that are required in each code word. Similarly, decreasing the forward error correcting power increases the effective data throughput as a direct result of a lower forward error correction overhead. The forward error correction and channel parameters that are utilized by the algorithm described in this invention are as follows:

UNCORRECT_CW: The number of uncorrectable erred code words received.

CORRECTED_CW: The number of code words received that contained errors that were corrected by the FEC process.

TOTAL_CW: The total number of code words received, including corrected, uncorrected, and non-erred.

CW_LENGTH: The total code word length (in bytes) including both the information or application portion and the error correcting portion.

CB_LENGTH: The number of bytes in the error correcting portion, which in one embodiment is twice the number of bytes that the forward error correction code is capable of correcting.

UNCORRECT_CW, CORRECTED_CW, and TOTAL_CW are metrics that are commonly available in most commercial-off-the-self FEC chips. CW_LENGTH and CB_LENGTH are the two parameters the present invention seeks to adapt to an optimized level dependent on channel noise conditions.

According to the forward error correction algorithm of the present invention, the forward error correction parameters are optimized by dynamically selecting a value for the parameters CW_LENGTH and CB_LENGTH that achieves a target bit error rate and minimizes the forward error correction overhead (which also maximizes the data throughput) while not exceeding a maximum system latency requirement. Typically, communications systems are constrained by the maximum allowable latency. Within the context of this invention, latency may be defined as the time period between the demodulation of the input signal to extract the bit stream at the receiver and the point at which the bit stream has been corrected as a result of the FEC process and is available to the user. The receiver processor will process the bit stream from the demodulator according to the FEC algorithm and correct the erred bytes as necessary. This processing thus introduces additional latency into the data flow.

The following three application-specific parameters are selected by the communications system user based on the requirements of the communications network: (1) target bit error rate (TBER), (2) MAXIMUM_OVERHEAD, which is the maximum FEC overhead allowed, which thereby specifies the minimum information bandwidth, and (3) MAXIMUM_LATENCY, which is the maximum packet delay that will be tolerated by the system users due to FEC processing. Note, that in one embodiment of the present invention, the optimized system parameter is bit error rate; but the optimization of this parameter is not a requirement of the present invention. Other signal quality metrics could be used to optimize the performance of the FEC process including: data packet error rate and FEC code block error rate.

The maximum latency (MAXIMUM_LATENCY) requirement is selected by the user as a function of the type of network application to be supported by the communications channel. For example, a voice-over-IP (VoIP) application generally has tight latency requirements and would probably result in a maximum latency less than 100 milliseconds, whereas a typical high-speed data application might tolerate rather excessive latency and thus the user might bound this parameter to 500 milliseconds or more. Generally, FEC processing integrated circuit specifications include a formula for their latency calculation. For example, the LSI L64714 FEC decoder mentioned above introduces a latency equal to that given in equation (1) below. These relationships are commonly nonlinear, which means that each combination of CW_LENGTH and CB_LENGTH has to be evaluated separately and a single independent bound for both CW_LENGTH and CB_LENGTH cannot be determined.

$$\text{Latency} = f_L(CW\_LENGTH, CB\_LENGTH) = TRUNC[(16*CW\_LENGTH + CB\_LENGTH^2 + 4*CB\_LENGTH + 73)/8]*8 + 12 \quad (1)$$

Similarly, the maximum overhead (MAXIMUM_OVERHEAD) requirement is selected to reflect the minimum acceptable communications channel throughput acceptable. For example, if user is designing a voice application to be supported by a communications channel with a raw data rate of 40 megabits/second and based upon the number of users that must be serviced and the data rate for each user, computes that the channel must provide 30 megabits/second to meet the application demand, then the minimum required channel utilization would be 30/40=0.75 or 75%. The maximum overhead is therefore equal to 1 minus the minimum channel utilization, which is in this example 0.25 or 25%. Equation (2) gives the overhead calculation as related to the overhead caused by FEC processing.

$$\text{Overhead} = f_o = CB\_LENGTH/CW\_LENGTH \quad (2)$$

Most applications for a communications system have a target bit error rate beyond which system performance is unacceptable. Typically, a bit error rate of $1 \times 10^{-6}$ (which means one bit error for every 1,000,000 bits) is quite common. As will be shown in conjunction with FIG. 2 in accordance with the teachings of the present invention, the target bit error rate drives the process of updating the forward error correction parameters and also the number of bits required to be received to reasonably estimate the actual bit error rate, referred to herein as the sample window size (SWS). The sample window size is related to the length of the time required to reasonably determine the actual bit error rate. For example, if the user is trying to optimize the system to perform at a bit error rate (BER) of $10^{-6}$, that is 1 bit error every 1,000,000, then the sample window must be a minimum of 1,000,000 bits before a decision is made as to whether or not to adjust the current FEC settings. More practically, the decision window should typically be 5,000,000 to 10,000,000 bits. Therefore, to ensure an acceptably accurate estimate of the actual bit error rate, a sample window size for the bit error rate calculation must be a minimum of 1/BER bits and preferably 5/BER bits. After collecting the required number of bits, the process calculates the system bit error rate (calculated bit error rate or CBER) as follows:

$$CBER = UNCORRECT\_CW/SWS \quad (3)$$

where UNCORRECT_CW is the number of erred code words not corrected during the sample window and SWS is the total number of bits sent by the transmitter (including correct bits and erred bits) during the sample window interval. It is calculated as follows:

$$SWS = TOTAL\_CW * CW\_LENGTH * 8 \quad (4)$$

Equation (3) is an estimate of a BER, because in one embodiment it is not possible to determine exactly how many bits were corrupted within the uncorrectable FEC code word, only the number of uncorrected code words can be determined. However, equation (3) assumes that each uncorrectable code word block is the result of one bit error in excess of the correction capability of the FEC algorithm. This calculation functions well as a lower bound on the actual bit error rate and allows adequate adjustment of the FEC parameters in accordance with the present invention. Note, if in other embodiments of the present invention system metrics other than the bit error rate, such as packet error rate or FEC code word error rate, are used, similar issues will be encountered but may be addressed in the same manner. The key factor in this calculation is not the magnitude of the difference between the CBER and TBER as the proposed algorithm within this invention does not base the FEC parameter adjustments on the magnitude, but only the adjustment "direction". If the CBER is greater than the TBER, then additional FEC correction power is added. If the CBER is less than the TBER, then the process is adjusted to utilize less FEC correction power. As stated earlier, other error metrics in lieu of bit error rate could be used and would generally result in modifications to the SWS calculation. For example, if the code word error rate was used, then SWS would be equal to TOTAL_CW.

Figure 2:
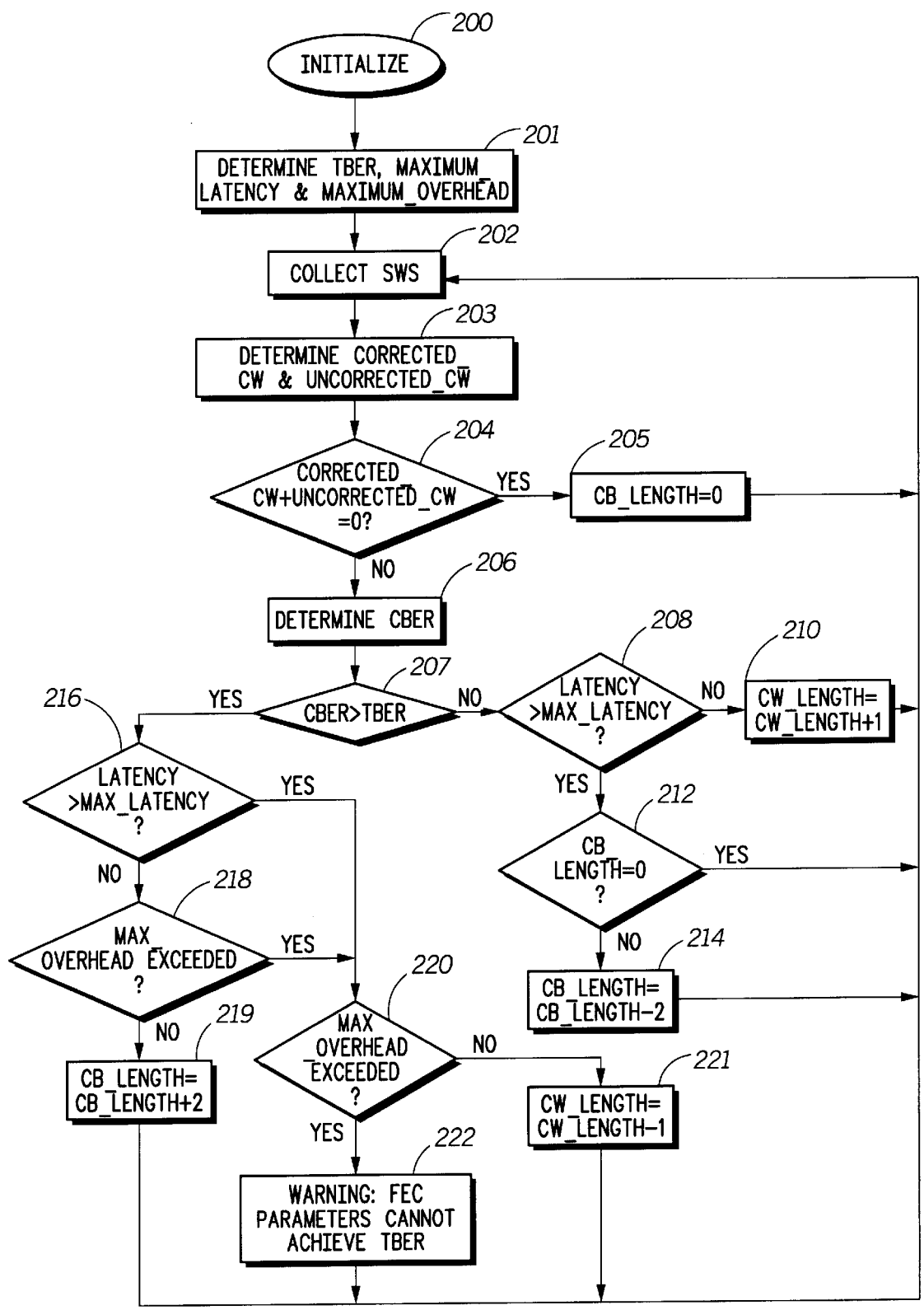
FIG. 2 is a flow chart illustrating the adaptive forward error correction techniques associated with the present invention.

FIG. 2 illustrates a process according to the teachings of the present invention for dynamically establishing the forward error correction parameters, in particular, the code word length (in bytes) and the check byte length (also in bytes). The process of FIG. 2 can be implemented by a dedicated microprocessor or a microprocessor with multiple functions in the receiver where the FEC process is performed. The process of FIG. 2 begins at an initialization step 200 and proceeds to a step 201 where the TBER, MAXIMUM_LATENCY, and MAXIMUM_OVERHEAD are established by the user. At a step 202 a number of data samples equal to the sample window size is collected (See Equation (4)). Preferably, the number of samples is equal to a minimum of 5/BER. As applied to a system having a bit error rate of $1 \times 10^{-6}$, the sample window size would therefore preferably be $5 \times 10^6$ bits.

The values CORRECTED_CW and UNCORRECTED_CW are determined by the circuit or integrated circuit implementing the FEC scheme at a step 203, based on the bits received during the simple window, and input to the FIG. 2 process. At this point, in one embodiment, an optional calculation can be made as shown at a decision step 204. If the number of corrected code words (CORRECTED_CW) plus the number of uncorrectable code words (UNCORRECT_CW) is equal to zero then no forward error correction is being applied (and none is required) and the system can immediately reap the full bandwidth of the channel by setting the check bytes length (CB_LENGTH) to zero at a step 205. Note, this step 205 essentially disables the FEC since no checksum bytes are added to the transmitted data. Alternatively, the communications system could be allowed to adapt to the channel noise conditions, resulting in the iterative decrementing of the CB_LENGTH by two until zero value is reached, by processing the steps 206–221, which are further discussed below.

The calculated bit error rate is determined at a step 206 using equation (3) above, using the UNCORRECTED_CW value from the step 203 and the sample window size from the step 202. For example, assuming a sample window size of S/BER, where the desired bit error rate is $1 \times 10^{-6}$ and the number of uncorrectable FEC blocks is 10. The resulting calculated bit error rate (CBER) is:

$$CBER = 10/(5/1 \times 10^{-6})$$

$$CBER = 2 \times 10^{-6}$$

After the bit error rate is calculated, processing moves to a decision step 207 where the calculated bit error rate is compared with the target bit error rate. If the calculated bit error rate is greater than the target bit error rate, than the forward error correcting power must be increased to reduce the calculated bit error rate. This process to reduce the bit error rate follows the affirmative path leading from the decision step 207. If the calculated bit error rate is less than the target bit error rate, meaning that fewer errors are occurring on the channel than the target number of errors, than the error correcting power can be decreased (following the negative path from the decision step 207) to allow the calculated bit error rate to increase. The teachings of the present invention allow these changes to the forward error correcting power in an incremental and controlled manner. In particular, once the forward error correcting power is changed, as will be discussed further in conjunction with the remaining steps of FIG. 2, processing always returns to the step 202 for the collection of additional samples, a recalculation of the calculated bit error rate, and comparison with the target bit error rate.

Returning to the decision step 207, if the calculated bit error rate is less than the target bit error rate, then an "excessive" amount of error correcting power is being applied to the communications system. Processing moves from the decision step 207 to a decision step 208 where a determination is made as to whether an increase in the code word length would cause the maximum latency value to be exceeded. In particular, the latency value (as given for the LSI L64714 FEC decoder in equation (1)) is compared with the MAXIMUM_LATENCY value specified by the user. When calculating the latency value in accordance with equation (1), the function parameters are CB_LENGTH and (CW_LENGTH+1). This calculation will indicate whether the system latency will exceed the maximum latency in the event that the CW_LENGTH is incremented by one, as shown at a step 210. If the maximum latency would not be exceeded by the CW_LENGTH adjustment, then the length is increased at the step 210. Once the code word length has been increased at the step 210, the process returns to the step 202 for collecting more samples recalculating the actual bit error rate at the step 206, for comparison with the target bit error rate at the step 207.

Returning to the decision step 208, if the MAX_LATENCY would be exceeded by increasing the code word length, it is still desirable to decrease the forward error correcting power, but this cannot be accomplished by increasing the code word length. Processing continues to a decision step 212 where the number of error correcting bytes is compared to zero. Recall that the check byte length is twice the number of bytes correctable by the forward error correction code. A check byte length of zero indicates that the forward error correction process has zero correcting power and, therefore, the FEC is disabled. If the check byte length is zero at the decision step 212, it cannot be lowered to decrease the forward error correcting power, and processing therefore returns to the step 202. If the check byte length is non-zero, then from the decision step 212, the process continues to a step 214 where the check byte length value is decreased by two bytes, and the process returns to step 202. The values used at the steps 210 and 214 (i.e., +1 and −2) can be selected based on the desired system performance and robustness.

Returning to the decision step 207, if the calculated bit error rate is greater than the target bit error rate, the process responds by increasing the forward error correction power along the affirmative path from the decision step 207. The first alternative is to increase the number of check bytes. This is accomplished by first determining if increasing the check byte length will result in either the MAXIMUM_LATENCY (where the actual latency is calculated per equation (1)) or the MAXIMUM_OVERHEAD (where the actual overhead is calculated per equation (2)) being exceeded as determined at the decision steps 216 and 218. To determine the actual latency, the functional values inserted into equation (1) are (CB_LENGTH+2) and CW_LENGTH. Using these values allows the determination of whether the actual latency will exceed the MAXIMUM LATENCY if the CB_LENGTH value is incremented, later in the process. Similarly, in calculating the actual overhead required for the decision at a step 218, the numerator (of equation (2)) is CB_LENGTH+2 and the denominator is CW_LENGTH. Again, use of these values takes into consideration the potential change in the CB_LENGTH executed in subsequent process steps. If neither the MAXIMUM LATENCY nor the MAXIMUM OVERHEAD conditions are exceeded, then the processing proceeds to a step 219 where the check byte length is increased by two, thereby increasing the forward error correcting power, after which the process returns to the step 202.

If either the MAXIMUM LATENCY or MAXIMUM OVERHEAD overhead requirements is exceeded as determined at the decision steps 216 and 218, processing proceeds to a decision step 220 to determine if a decrease in the code word length will still satisfy the MAXIMUM_OVERHEAD requirement. In calculating the overhead value for the decision step 220, the overhead calculation utilizes a code word length of (CW_LENGTH−1) in the denominator and CB_LENGTH in the numerator of equation (2). At the decision step 220 the value calculated from equation (2) is compared with the MAXIMUM_OVERHEAD value. If the maximum overhead is not exceeded, then processing proceeds to step 221 where the code word length is decreased, after which processing returns to a step 202.

If the code word length has reached its minimum value as determined by the overhead calculation at the decision step 220, then processing moves to a step 222. Since the code word length cannot be further decreased (and the check byte length cannot be increased as indicated at the decision steps 216 and 218), then the system cannot satisfy the target bit error rate. Therefore, a warning message is displayed as shown at a step 222, after which processing returns to a step 202.

Once the code word length and check byte length parameters (CW_LENGTH and CB_LENGTH) are calculated, they must be transmitted back to the transmitter for implementation as the data stream is encoded. U.S. Pat. No. 5,699,365, assigned to the assignee of the present invention, provides for a technique for communicating these new parameters to the transmitter.

In addition to using the calculated bit error rate as determined at the step 206 to determine whether to increase or decrease the forward error correcting power, in other embodiments a packet error rate or frame error rate can also be utilized. The process of calculating these latter mentioned error rates is similar to the process of calculating the bit error rate. The decision step 207 would then involve comparing the target frame or packet error rates with the corresponding calculated value.

It should be noted that a preferred embodiment of the process of this invention would utilize a shortened forward error correction implementation in the communication system. A shortened forward error correcting code refers to those error correction algorithms that do not require code words to be padded (i.e., bytes or bits added) to achieve a predetermined code word length. In a typical data transmission, the number of information bytes that need to be sent often exceeds the number of information bytes available in a codeword having FEC capabilities. Therefore, multiple code words are sent and it is likely that the information bytes will not completely fill the last code word. In a padded scheme, therefore, the last code word be padded with additional data bits (such as zeros). Instead, in a shortened forward error correction scheme, the length of the last code word would not be lengthened, so that any given code word length is acceptable. These types of approaches are known in the art; see the DOCSIS 1.0 specification for example. As those skilled in the art recognize, if a shortened FEC processing scheme is not used, then the affects of data padding would have to be incorporated into the latency and overhead calculations for the adaptive FEC scheme of the present invention.

While the invention has been described with reference to a preferred embodiment, it will be understood by those skilled in the art that various changes may be made and equivalent elements may be substituted for elements thereof without departing from the scope of the present invention. In addition, modifications may be made to adapt a particular situation to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for adaptive forward error correction in a communications channel conveying code words including an information portion and an error correcting portion, wherein a maximum latency value and a maximum overhead value are established for the communications channel, said method comprising:

(a) monitoring a channel parameter to form a monitored parameter;

(b) determining a threshold value of the monitored parameter;

(c) comparing the monitored parameter with the threshold value;

(d) when the monitored parameter has a second predetermined relation to the threshold value, determining whether increasing the code word length by a first predetermined value will cause the latency time to exceed the maximum latency value;

(e) if increasing the code word length by the first predetermined value will not cause the latency time to exceed the maximum latency value, increasing the code word length by the first predetermined value;

(f) if increasing the code word length by the first predetermined value will cause the latency time to exceed the maximum latency value, determining whether the error correcting portion length is zero;

(g) if the error correcting portion length is not equal to zero, decreasing the error correcting portion length by a second predetermined value;

(h) when the monitored parameter has a first predetermined relation to the threshold value, determining whether increasing the error correcting portion length by a third predetermined value will cause the latency time to exceed the maximum latency value or will cause the overhead value to exceed the maximum overhead value;

(i) if increasing the error correcting portion length by the third predetermined value will not cause the latency time to exceed the maximum latency value and will not cause the overhead value to exceed the maximum overhead value, increasing the error correcting portion length by the third predetermined value;

(j) if increasing the error correcting portion length will cause the latency time to exceed the maximum latency value or will cause the overhead value to exceed the maximum overhead value, determining if a reduction in the code word length by a fourth predetermined value will cause the overhead value to exceed the maximum overhead value;

(k) if the reduction in the code word length by the fourth predetermined value will not cause the overhead value to exceed the maximum overhead value, decreasing the code word length by the fourth predetermined value; and (l) if the reduction in the code word length by the fourth predetermined value will cause the overhead value to exceed the maximum overhead value, determining that the method ca achieve the threshold value.

2. The method of claim 1 wherein the monitored parameter is bit error rate.

3. The method of claim 1 wherein the latency time is a function of the code word length and the error correcting portion length.

4. The method of claim 1 wherein the overhead value is a function of the code word length and the error correction portion length.

5. The method of claim 1 wherein the step (a) further comprises:

(a1) when the number of error-corrected code words plus the number of erred but uncorrected code words is zero, setting the error correction portion length to zero; and (a2) monitoring a channel parameter to form a monitored parameter.

6. The method of claim 1, further comprising a step (m) repeating steps (a) through (l).

7. The method of claim 6 wherein the steps of increasing or decreasing the error correction portion length or of increasing or decreasing the code word length includes incrementing or decrementing, respectively, by predetermined factors.

8. The method of claim 1 wherein the monitored parameter is calculated based on a minimum number of sample values for the monitored parameter.

9. The method of claim 8 wherein the minimum number of sample values is a function of the threshold value for the monitored parameter.

10. A method for adaptive forward error correction in a communications channel conveying code words including an information portion and an error correcting portion representing a forward error correcting power, wherein a maximum data processing constraint value is established for the communications channel, said method comprising:

(a) monitoring a channel parameter to form a monitored parameter;

(b) determining a threshold value of the monitored parameter;

(c) comparing the monitored parameter with the threshold value; and (d) increasing the information portion length and/or decreasing the error correcting portion length when the monitored parameter has a second predetermined relation to the threshold value, and when increasing the information portion length and/or decreasing the error correcting portion length will not cause the data processing constraint value to be exceeded.

11. The method of claim 10 wherein the data processing constraint is latency time.

12. A method for adaptive forward error correction in a communications channel conveying code words including an information portion and an error correcting portion representing a forward error correcting power, wherein a maximum data processing constraint value is established for the communications channel, said method comprising:

(a) monitoring a channel parameter to form a monitored parameter;

(b) determining a threshold value of the monitored parameter;

(c) comparing the monitored parameter with the threshold value; and (d) decreasing the information portion length and/or increasing the error correcting portion length when the monitored parameter has a first predetermined relation to the threshold value, and when decreasing the information portion length and/or increasing the error correcting portion length will not cause the data processing constraint value to be exceeded.

13. The method of claim 12 wherein the data processing constraint is latency time.

14. A method for adaptive forward error correction in a communications channel conveying code words including an information portion and an error correcting portion, wherein a maximum data processing constraint value is established for the communications channel, said method comprising:

(a) monitoring a channel parameter to form a monitored parameter;

(b) determining a threshold value of the monitored parameter;

(c) comparing the monitored parameter with the threshold value; and (d) increasing the information portion length and/or decreasing the error correcting portion length when the monitored parameter has a second predetermined 5 relation to the threshold value, and when increasing the information portion length and/or decreasing the error correcting portion length will not cause the data processing constraint value to be exceeded.

15. The method of claim 14 wherein the data processing constraint is overhead.

16. A method for adaptive forward error correction in a communications channel conveying code words including an information portion and an error correcting portion, wherein a maximum data processing constraint value is established for the communications channel, said method comprising:

(a) monitoring a channel parameter to form a monitored parameter;

(b) determining a threshold value of the monitored parameter;

(c) comparing the monitored parameter with the threshold value; and (d) decreasing the information portion length and/or increasing the error correcting portion length when the monitored parameter has a first predetermined relation to the threshold value, and when decreasing the information portion length and/or increasing the error correcting portion length will not cause the data processing constraint value to be exceeded.

17. The method of claim 16 wherein the data processing constraint is overhead.

18. A computer program product comprising a computer-usable medium having a computer-readable code therein for providing adaptive forward error correction wherein a maximum latency value and a maximum overhead value are established for the communications channel, the computer-readable code in the article of manufacture comprising:

(a) a computer-readable program code module for monitoring a channel parameter to form a monitored parameter;

(b) a computer-readable program code module for determining a threshold value of the monitored parameter;

(c) a computer-readable program code module for comparing the 15 monitored parameter with the threshold value;

(d) when the monitored parameter has a second predetermined relation to the threshold value, a computer-readable program code module for determining whether increasing the code word length will cause the maximum latency value to be exceeded;

(e) a computer-readable program code module for increasing the code word length if the increased code word length does not create a latency time in excess of the maximum latency value;

(f) if the increase in the code word length results in a latency time in excess of the maximum latency value, a computer-readable program code module for determining whether the error correcting portion length is zero;

(g) if the error correcting code length is not zero, a computer-readable program code module for decreasing the error correcting portion length;

(h) when the monitored parameter has a first predetermined relation to the threshold value, a computer-readable program code module for determining whether an increase in the error correcting portion length results in a latency time in excess of the maximum latency value or results in an overhead value in excess of the maximum overhead value;

(i) if an increase in the error correcting portion length does not result in a latency time in excess of the maximum latency value and does not result in an overhead value in excess of the maximum overhead value, a computer-readable program code module for increasing the error correcting portion length;

(j) if an increase in the error correcting portion of the code word results in a latency time in excess of the maximum latency value or results in an overhead value in excess of the overhead value, a computer-readable program code module for determining if a reduction in the total code word length results in an overhead value in excess of the maximum overhead value;

(k) if the reduction in the code word length does not result in an overhead value in excess of the maximum overhead value, a computer-readable program code module for decreasing the code word length; and (l) if the reduction in the code word length would result in an overhead value in excess of the maximum overhead value, a computer-readable program code module for determining that the method cannot achieve the threshold value.

* * * * *